United States Patent
Ando et al.

(10) Patent No.: US 11,949,347 B2
(45) Date of Patent: Apr. 2, 2024

(54) POWER CONVERSION DEVICE

(71) Applicants: FUJI ELECTRIC CO., LTD., Kawasaki (JP); HONDA MOTOR CO., LTD., Tokyo (JP)

(72) Inventors: Nobuhisa Ando, Suzuka (JP); Hiroki Katsumata, Hino (JP); Masahiko Sato, Tokyo (JP)

(73) Assignees: FUJI ELECTRIC CO., LTD., Kawasaki (JP); HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/460,990

(22) Filed: Aug. 30, 2021

(65) Prior Publication Data
US 2022/0109382 A1 Apr. 7, 2022

(30) Foreign Application Priority Data
Oct. 1, 2020 (JP) .................. 2020-166764

(51) Int. Cl.
*B60L 53/60* (2019.01)
*G01R 31/52* (2020.01)
(Continued)

(52) U.S. Cl.
CPC ............. *H02M 7/797* (2013.01); *B60L 53/60* (2019.02); *G01R 31/52* (2020.01); *H02M 1/36* (2013.01);
(Continued)

(58) Field of Classification Search
CPC ......... H02M 7/797; H02M 1/36; B60L 53/60; B60L 2210/30; B60L 2210/40;
(Continued)

(56) References Cited

U.S. PATENT DOCUMENTS

2008/0073135 A1* 3/2008 Oyobe .................. B60L 50/16
322/17
2011/0013322 A1 1/2011 Gale et al.
(Continued)

FOREIGN PATENT DOCUMENTS

JP 2003249160 * 9/2003
JP 2006-101632 A 4/2006
(Continued)

OTHER PUBLICATIONS

Japan Patent Office National Intellectual Property Administration, "Office Action for Japanese Patent Application 2020-166764," dated May 24, 2022.
(Continued)

*Primary Examiner* — Rexford N Barnie
*Assistant Examiner* — Xuan Ly
(74) *Attorney, Agent, or Firm* — Manabu Kanesaka

(57) ABSTRACT

A power conversion device includes a power converter to output AC power by converting input DC power, an electric leakage detector to detect electric leakage in a power supply line through which the AC power output by the power converter flows when the AC power is being output by the power converter, and a power conversion controller configured to control power conversion of the power converter. The power conversion controller is configured to stop power conversion operation of the power converter based on a detection result of the electric leakage detector.

3 Claims, 4 Drawing Sheets

(51) Int. Cl.
H02M 1/36 (2007.01)
H02M 7/797 (2006.01)

(52) U.S. Cl.
CPC ....... *B60L 2210/30* (2013.01); *B60L 2210/40* (2013.01)

(58) Field of Classification Search
CPC ....... B60L 53/22; B60L 3/0069; G01R 31/52; G01R 31/006; Y02T 10/70; Y02T 10/7072; Y02T 10/92; Y02T 90/12; Y02T 90/14; H02J 2207/20; H02J 7/0029; H02J 7/02
USPC .......................................................... 307/9.1
See application file for complete search history.

(56) References Cited

U.S. PATENT DOCUMENTS

| | | |
|---|---|---|
| 2013/0286514 A1 | 10/2013 | Oguchi et al. |
| 2020/0062125 A1 | 2/2020 | Brauner et al. |
| 2020/0122585 A1 | 4/2020 | Bhat et al. |

FOREIGN PATENT DOCUMENTS

| | | | |
|---|---|---|---|
| JP | 2011-024410 A | | 2/2011 |
| JP | 2011-135663 A | | 7/2011 |
| JP | 2014-057407 A | | 3/2014 |
| JP | 2014057407 | * | 3/2014 |
| JP | 2015-008613 A | | 1/2015 |
| JP | 2015008613 | * | 1/2015 |
| JP | 2019-122238 A | | 7/2019 |
| JP | 2019122238 | * | 7/2019 |
| WO | 2012/086674 A1 | | 6/2012 |

OTHER PUBLICATIONS

European Patent Office, "Extendned European Search Report and Search Opinion for European Patent Application 21194397.2," dated Feb. 18, 2022.

Japan Patent Office, "Office Action for Japanese Patent Application 2020-166764," dated Nov. 29, 2022.

* cited by examiner

POWER CONVERSION DEVICE

CROSS-REFERENCE TO RELATED APPLICATION

The present application claims priority of Japanese Patent Application No. 2020-166764 filed Oct. 1, 2020, the disclosure of which is hereby incorporated by reference.

BACKGROUND OF THE INVENTION

Field of the Invention

The present invention relates to a power conversion device, and more particularly, it relates to a power conversion device that detects electric leakage.

Description of the Background Art

A power conversion device that detects electric leakage is known in general, as disclosed in Japanese Patent Laid-Open No. 2011-135663, for example.

An in-vehicle charging system (power conversion device) described in Japanese Patent Laid-Open No. 2011-135663 includes a power conversion circuit (power converter) that converts commercial power supplied via a power supply line and supplies charging power to a high-voltage battery mounted on a vehicle. This in-vehicle charging system further includes a breaking means (breaker) that cuts off the power supply line when an electric leakage state is detected at the time of supplying commercial power. The power supply line is cut off by the breaker such that power supply from a commercial power supply to the power conversion circuit is stopped. In the in-vehicle charging system described in Japanese Patent Laid-Open No. 2011-135663, the breaking means (breaker) is connected between a charging connector provided on a vehicle body and the power conversion circuit.

A power conversion device such as the in-vehicle charging system described in Japanese Patent Laid-Open No. 2011-135663 may be configured to convert DC power stored in the high-voltage battery into AC power and output the AC power. In such a configuration, when electric leakage is detected when the DC power from the high-voltage battery is converted to AC power and output, it is necessary to quickly cut off conduction in the power supply line and cut off the output of AC power from the power converter. However, when conduction in a power supply line is cut off by a breaker as a breaking means as in the in-vehicle charging system described in Japanese Patent Laid-Open No. 2011-135663, generally, a slight time lag occurs between the timing at which electric leakage is detected and the timing at which the breaker cuts off conduction in the power supply line. Therefore, there is a demand for a power conversion device capable of more quickly cutting off conduction of AC power when electric leakage is detected when DC power is converted into the AC power and output.

SUMMARY OF THE INVENTION

The present invention has been proposed in order to solve the aforementioned problems, and an object of the present invention is to provide a power conversion device capable of more quickly cutting off conduction of AC power when electric leakage is detected when DC power is converted into the AC power and output.

In order to attain the aforementioned object, a power conversion device according to an aspect of the present invention includes a power converter to output AC power by converting input DC power, an electric leakage detector to detect electric leakage in a power supply line through which the AC power being output by the power converter flows when the AC power is output by the power converter, and a power conversion controller configured to control power conversion of the power converter. The power conversion controller is configured to stop power conversion operation of the power converter based on a detection result of the electric leakage detector.

In the power conversion device according to this aspect of the present invention, as described above, the power conversion controller is configured to stop the power conversion operation of the power converter based on the detection result of the electric leakage detector. Accordingly, when the electric leakage detector acquires the detection result indicating that electric leakage has occurred in the power supply line, the output of the AC power from the power converter can be stopped. In general, as compared with a case in which conduction in the power supply line is cut off by a mechanical breaking device such as a breaker, conduction in the power supply line can be more quickly cut off by stopping the power conversion operation of the power converter under control of the power conversion controller. Therefore, conduction in the power supply line can be quickly cut off by performing a control to stop the power conversion operation of the power converter instead of using a mechanical breaking device such as a breaker. Consequently, in case electric leakage is detected when DC power is converted into AC power and output, conduction of the AC power can be cut off more quickly.

In the aforementioned power conversion device according to this aspect, the power converter preferably performs, in a switching manner, conversion of DC power output from a power storage inside a vehicle into AC power and conversion of AC power input from an AC power source outside the vehicle into DC power with which the power storage is chargeable, and the electric leakage detector preferably detects the electric leakage in the power supply line when the AC power output from the power converter is being output to an outside of the vehicle. Accordingly, even when power conversion to charge the power storage of the vehicle and power conversion to supply power to an external device by discharging from the power storage are performed by a common device, it is possible to detect electric leakage that occurs when power is being supplied to the external device without additionally providing a new device configuration. Consequently, when power is supplied from the power storage of the vehicle to the external device, it is possible to stop power output more quickly when there is electric leakage while significantly reducing or preventing the complexity of the device configuration.

In this case, the electric leakage detector preferably detects the electric leakage in the power supply line due to electric leakage on a side of an external device externally connected to the vehicle. When power is supplied from the vehicle to the external device in which electric leakage has occurred, an unintended current flows through the power supply line and the external device. Therefore, as described above, the electric leakage detector is configured to detect electric leakage in the power supply line due to electric leakage on the side of the external device externally connected to the vehicle such that even when electric leakage occurs outside the vehicle, power supply can be stopped quickly. Consequently, when power is supplied to the external device in which electric leakage has occurred, flowing of an unintended current to the power supply line and the external device can be significantly reduced or prevented.

In the aforementioned power conversion device including the power converter to perform, in a switching manner, conversion of the DC power output from the power storage inside the vehicle into AC power and conversion of the AC power input from the AC power source outside the vehicle into DC power with which the power storage is chargeable, the electric leakage detector preferably includes a zero-phase current transformer provided so as to surround the power supply line on an outer side relative to the power converter in the vehicle, and the power conversion controller is preferably configured to determine that the electric leakage has occurred in the power supply line when a current that flows through a secondary winding wire of the zero-phase current transformer is larger than a predetermined threshold. When no electric leakage occurs in the power supply line, the total value of the single-phase three-wire AC power taking into account the magnitude and direction of the current that flows through the power supply line is 0. When electric leakage occurs in the power supply line, the total value of the single-phase three-wire AC power taking into account the magnitude and direction of the current that flows through the power supply line becomes a value other than 0, and this becomes a leakage current value. In the present invention, as described above, the zero-phase current transformer is provided so as to surround the power supply line on the outer side relative to the power converter in the vehicle. Accordingly, a magnetic field is generated in the zero-phase current transformer according to the leakage current value of the power supply line. Then, due to the magnetic field generated in the zero-phase current transformer, a current is generated in the secondary winding wire of the zero-phase current transformer. Therefore, the zero-phase current transformer can detect, as a current that flows through the secondary winding wire, a current having a magnitude proportional to the leakage current value of the power supply line. Consequently, the electric leakage detector can detect that electric leakage has occurred in the power supply line based on the current that flows through the secondary winding wire. Furthermore, the power conversion controller determines that electric leakage has occurred in the power supply line when the current that flows through the secondary winding wire of the zero-phase current transformer is larger than the predetermined threshold, and thus a current smaller than the predetermined threshold and accidentally generated in the secondary winding wire due to noise or the like can be prevented from being detected as electric leakage in the power supply line. Therefore, it is possible to significantly reduce or prevent frequent stopping of power supply from the power converter due to a small current accidentally generated in the secondary winding wire.

The aforementioned power conversion device according to this aspect preferably further includes a breaker to cut off conduction in the power supply line under control of the power conversion controller, and the power conversion controller is preferably configured to stop the power conversion operation of the power converter and cause the breaker to cut off the power supply line based on the detection result of the electric leakage detector. Accordingly, when electric leakage is detected, in addition to stopping the output from the power converter, the breaker can cut off conduction in the power supply line, and thus conduction in the power supply line can be physically cut off while generation of a leakage current is significantly reduced or prevented. Therefore, it is possible to more effectively significantly reduce or prevent generation of a leakage current due to the electric leakage in the power supply line.

In the aforementioned power conversion device according to this aspect, the power converter preferably includes a switching element that is switched on and off based on a control signal from the power conversion controller, and the power conversion controller is preferably configured to stop the power conversion operation of the power converter by turning off the switching element by stopping an output of the control signal. In general, the response speed of the switching element including a semiconductor device included in the power converter is higher than the response speed of a mechanical breaking device such as a breaker or a mechanical relay. Therefore, as compared with a case in which power supply is cut off by a mechanical breaking device to stop the conversion operation of the power converter, power output can be stopped more quickly by stopping the power conversion operation by controlling the switching element. Furthermore, the switching element can be turned off by stopping the output of the control signal, and thus power output can be easily stopped when electric leakage is detected.

In the aforementioned power conversion device including the power converter to perform, in a switching manner, conversion of the DC power output from the power storage inside the vehicle into AC power and conversion of the AC power input from the AC power source outside the vehicle into DC power with which the power storage is chargeable, the power conversion controller is preferably configured to acquire electric leakage detection information based on the detection result of the electric leakage detector, and output the acquired electric leakage detection information to a vehicle body-side controller mounted on the vehicle. Accordingly, the information indicating that electric leakage has been detected by the electric leakage detector can be acquired by the vehicle body-side controller that controls each portion of the vehicle. Therefore, in the case of electric leakage, the operation of each portion of the vehicle can be controlled by the vehicle body-side controller. That is, under control of the vehicle body-side controller, a user can be notified by displaying detection of electric leakage on a display device, and power output from the power storage can be stopped, for example. Consequently, the electric leakage detection information is output to the vehicle body-side controller such that a control to deal with the electric leakage can be performed outside the power conversion device.

In this case, the power conversion controller is preferably configured to store the acquired electric leakage detection information. Accordingly, when electric leakage is detected, detailed information about the detected electric leakage can be stored. Therefore, an inspection worker can easily confirm and verify the detected electric leakage by referring to the stored electric leakage detection information when confirming and verifying the detected electric leakage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

The configuration of a power conversion device 100 according to this embodiment is now described with reference to FIGS. 1 to 8.

Figure 1:
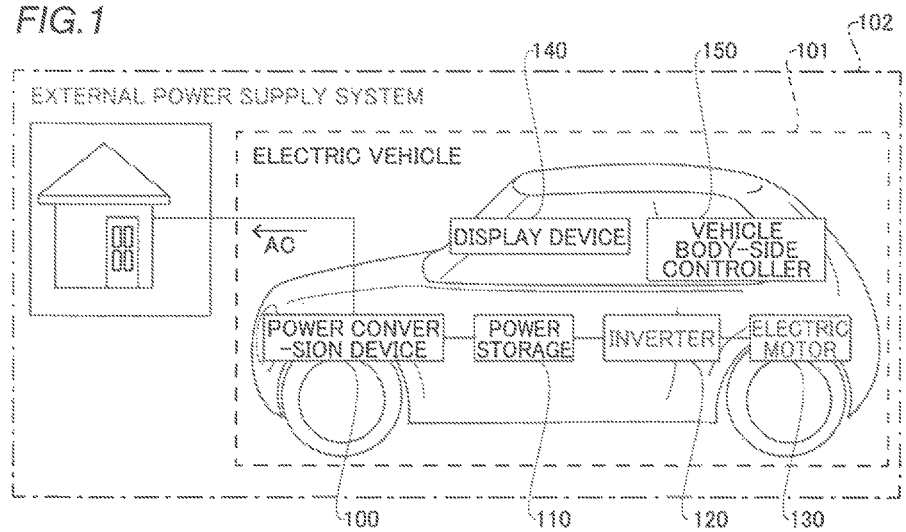
FIG. 1 is a diagram showing the overall configuration of an external power supply system including a power conversion device according to this embodiment.

As shown in FIG. 1, the power conversion device 100 according to this embodiment is mounted on an electric vehicle 101. The electric vehicle 101 travels by driving an electric motor 130 with power with which a power storage 110 has been charged. Furthermore, the electric vehicle 101 constitutes an external power supply system 102 capable of supplying (externally supplying power) the power in the power storage 110 to a home or the like. That is, the external power supply system 102 is a system capable of supplying single-phase three-wire commercial power (100 V/200 V AC power) to a house or the like by supplying power from the electric vehicle 101. The electric vehicle 101 is an example of a "vehicle" in the claims.

Configuration of Electric Vehicle

The electric vehicle 101 includes the power storage 110, an inverter 120, the electric motor 130, a display device 140, and a vehicle body-side controller 150 in addition to the power conversion device 100.

The power storage 110 includes a storage battery capable of charging power. The storage battery is a lithium-ion secondary battery, for example. The power storage 110 is charged with DC power obtained by converting AC power input from an AC power source outside a vehicle body by a power converter 4. Furthermore, the power storage 110 is charged with DC power directly input from a DC power source outside the vehicle body. The power storage 110 can be charged with (store) a power amount of 40 kWh (kilowatt hour), for example. The power storage 110 can output the stored power (power with which the power storage 110 has been charged) as DC power.

The inverter 120 converts the DC power output from the power storage 110 into AC power. The inverter 120 can change the frequency and voltage of the output AC power. The inverter 120 outputs AC power to drive the electric motor 130.

The electric motor 130 is driven with the power with which the power storage 110 has been charged. Specifically, the electric motor 130 is driven with the AC obtained by converting the DC power output from the power storage 110 by the inverter 120. The electric vehicle 101 travels with power by driving of the electric motor 130.

Figure 3:
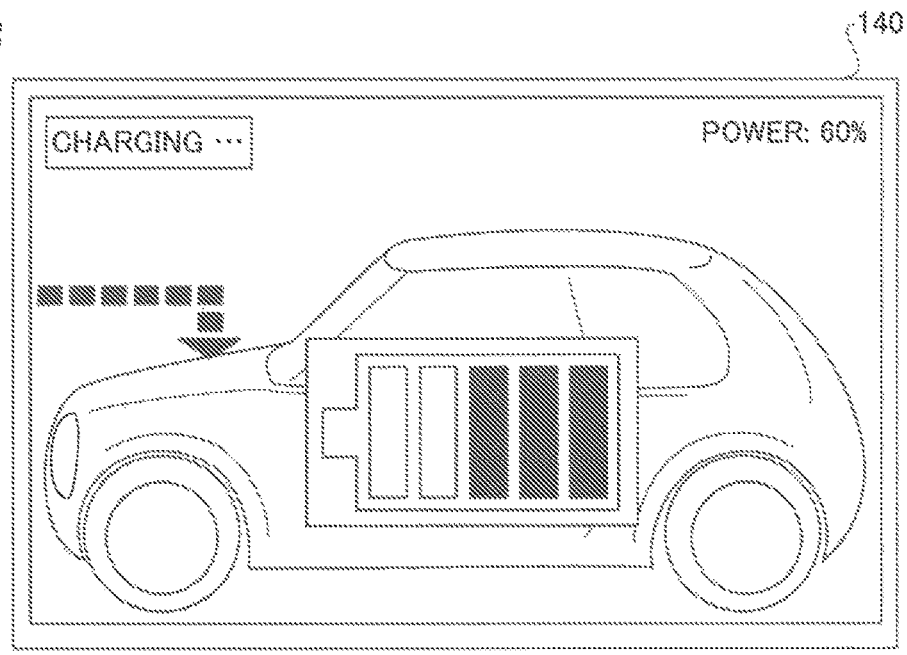
FIG. 3 is a diagram showing an exemplary display of a display device according to this embodiment.

As shown in FIG. 3, the display device 140 displays information on each portion of the electric vehicle 101 based on a control by the vehicle body-side controller 150 described below. That is, information on the states of the power storage 110 and the electric motor 130, for example, is displayed. For example, the display device 140 displays the charge amount of the power storage 110. When electric leakage is detected by the power conversion device 100 described below, a display is provided to notify a user that the electric leakage has been detected (see FIG. 7). The display device 140 includes a liquid crystal display, for example. The display device 140 is provided inside the electric vehicle 101, and displays the information on each portion of the electric vehicle 101 such that the user can visually recognize the information.

The vehicle body-side controller 150 controls each portion of the electric vehicle 101. Specifically, the vehicle body-side controller 150 includes a plurality of electronic control units (ECUs). Each of the plurality of ECUs controls each portion of the electric vehicle 101. For example, a battery ECU monitors and controls the input and output of power to and from the power storage 110, and controls the temperature of the power storage 110 by controlling a battery cooler and a battery heater of the power storage 110. Furthermore, a display control ECU controls a display of the display device 140 provided inside the electric vehicle 101. Each of the plurality of ECUs includes a microcomputer (microcontroller).

Configuration of Power Conversion Device

Figure 2:
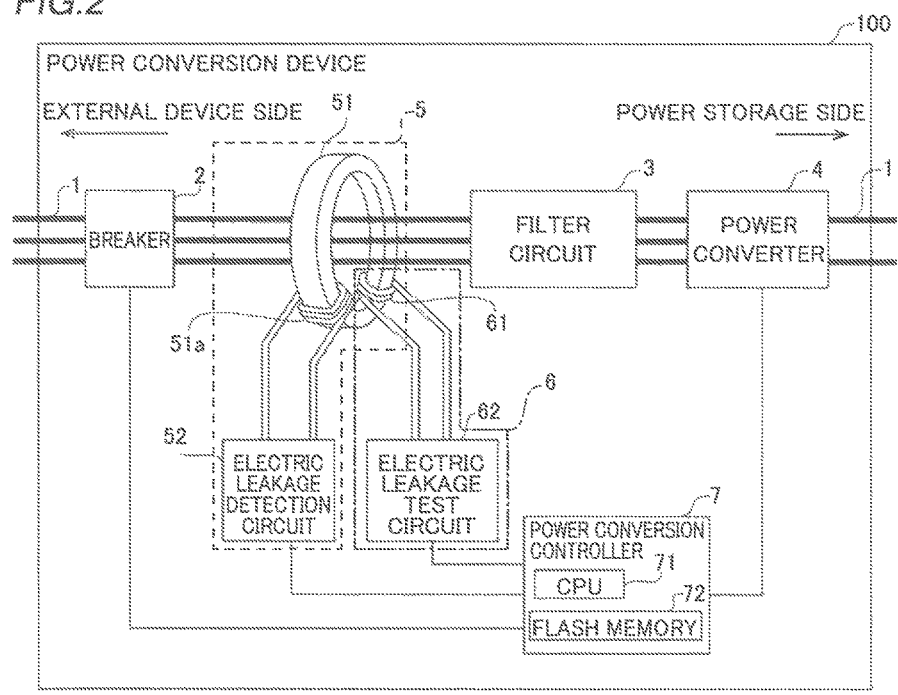
FIG. 2 is a schematic view for illustrating the configuration of the power conversion device according to this embodiment.

As shown in FIG. 2, the power conversion device 100 includes a power supply line 1, a breaker 2, a filter circuit 3, the power converter 4, an electric leakage detector 5, a failure determiner 6, and a power conversion controller 7. The power conversion device 100 is mounted on the electric vehicle 101, and converts the AC power input from the AC power source outside the electric vehicle 101 into DC power with which the power storage 110 is chargeable, and converts the DC power output from the power storage 110 inside the electric vehicle 101 into AC power to be output to the outside of the electric vehicle 101.

The power supply line 1 is a conducting wire through which an alternating current converted by the power converter 4 described below and a direct current output from the power storage 110 outside the power conversion device 100 flow in order to supply AC power to the outside of the device (the outside of the electric vehicle 101). Furthermore, in order to charge the power storage 110, a single-phase three-wire alternating current output from the AC power source outside the electric vehicle 101 and a direct current converted by the power converter 4 flow through the power supply line 1.

The breaker 2 cuts off conduction in the power supply line 1 when the AC power output from the power converter 4 is output to the outside of the electric vehicle 101 under control of the power conversion controller 7 described below. The breaker 2 includes a mechanical relay that mechanically cuts off conduction, for example.

The filter circuit 3 is an LC filter circuit that reduces the high frequency component of the alternating current that flows through the power supply line 1. The filter circuit 3 includes a capacitor and a coil (inductor).

Figure 4:
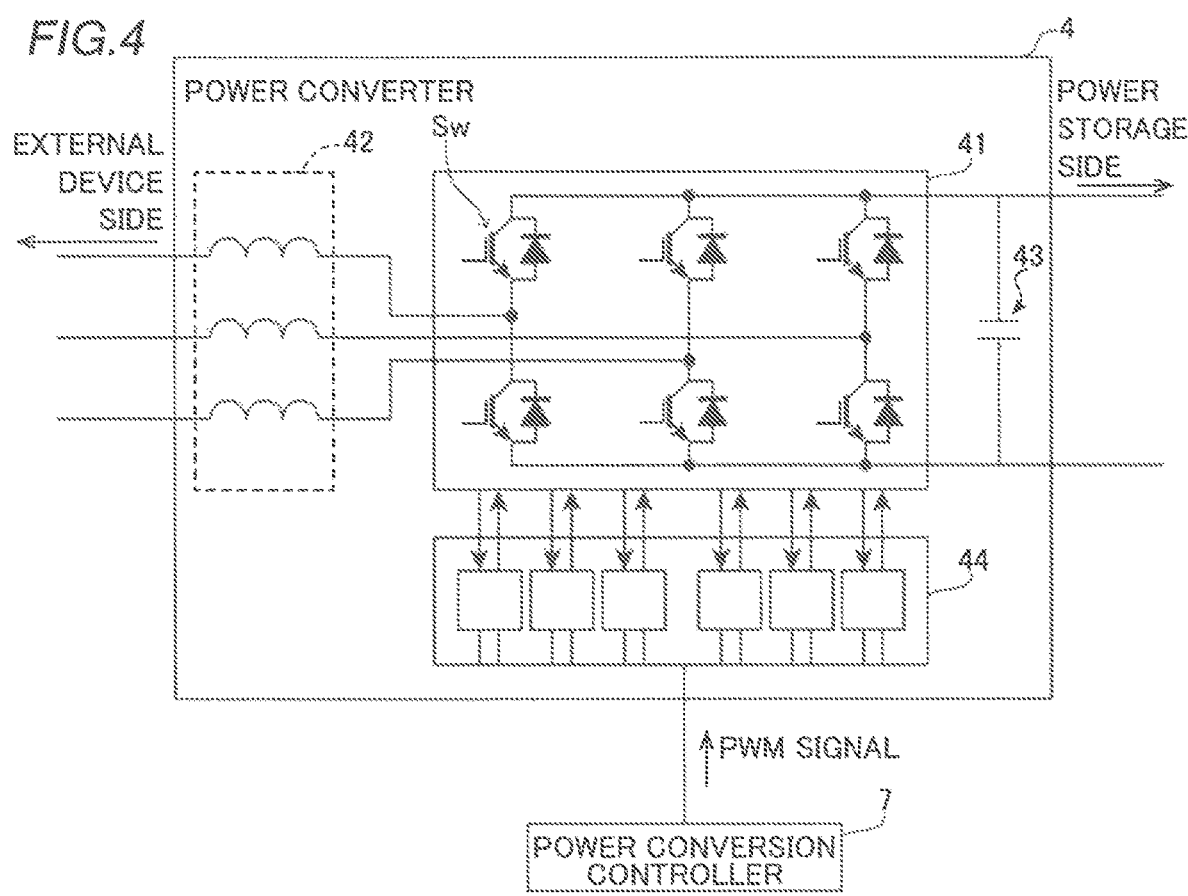
FIG. 4 is a diagram for illustrating a power converter according to this embodiment.

The power converter 4 is mounted on the electric vehicle 101. As shown in FIG. 4, the power converter 4 performs, in a switching manner, conversion of the DC power output from the power storage 110 inside the electric vehicle 101 into AC power and conversion of the AC power input from the AC power source outside the electric vehicle 101 into DC power with which the power storage 110 is chargeable based on a pulse width modulation (PWM) signal, which is a control signal output from the power conversion controller 7. The power converter 4 includes switching elements Sw that are switched on and off based on the control signal (PWM signal) from the power conversion controller 7. The switching elements Sw each includes an insulated gate bipolar transistor (IGBT), for example.

Specifically, the power converter 4 includes a bridge 41, an AC reactor 42, a smoothing capacitor 43, and a gate drive unit 44. The bridge 41 is a bridge circuit using an IGBT. The bridge 41 converts the DC power input from the power storage 110 side into AC power and converts the AC power input from the external device side into DC power based on the control signal from the power conversion controller 7. The AC reactor 42 suppresses harmonics included in the AC power and improves the power factor of the waveform of the alternating current. The smoothing capacitor 43 smooths DC power. The gate drive unit 44 outputs a gate signal to control the operation of the bridge 41 based on the control signal (PWM signal) from the power conversion controller 7. That is, the gate drive unit 44 outputs, to each of the switching elements Sw (IGBTs) included in the bridge 41, a gate signal to control the on and off states of the switching elements Sw.

As shown in FIG. 2, the electric leakage detector 5 detects electric leakage in the power supply line 1 through which the AC power output by the power converter 4 flows when the AC power is output by the power converter 4. Specifically, the electric leakage detector 5 detects the leakage current of the power supply line 1 due to electric leakage in the external device externally connected to the electric vehicle 101 when the AC power output from the power converter 4 is output to the outside of the electric vehicle 101. That is, the electric leakage detector 5 detects electric leakage in the power supply line 1 when the electric leakage occurs in the external device to which AC power is supplied from the power conversion device 100 or the external power supply line.

When the DC power output from the power storage 110 is converted such that AC power is output from the power converter 4, single-phase three-wire AC power flows through the power supply line 1 on the external device side of the power converter 4. Normally, when there is no electric leakage, the sum of the single-phase three-wire AC power taking into account the magnitude and direction of a current that flows through the three wires is 0. When electric leakage occurs in one of three conducting wires through which a single-phase three-wire alternating current flows, the sum taking into account the magnitude and direction of the current that flows through the three conducting wires is not 0, and is a leakage current value. The electric leakage detector 5 detects the electric leakage in the power supply line 1 by detecting the value of a leakage current that flows through the power supply line 1, which is a single-phase three-wire system.

Figure 5:
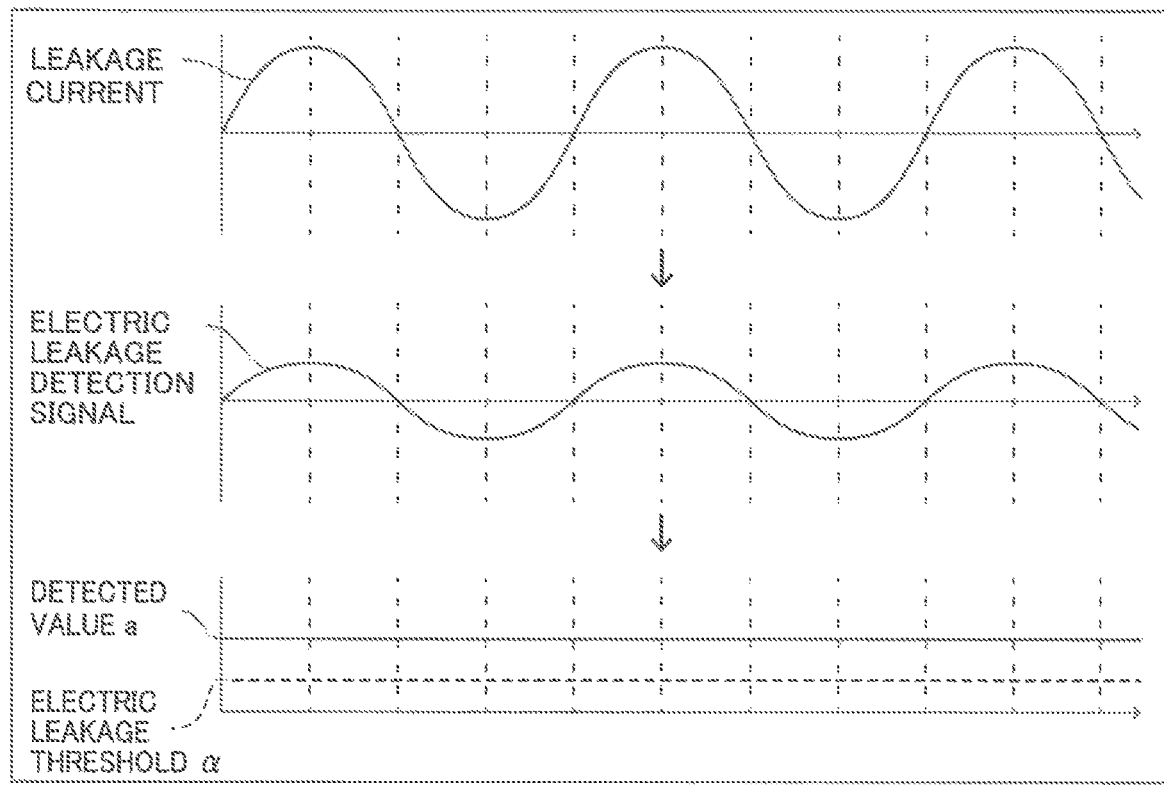
FIG. 5 is a diagram for illustrating the output of a detected value by an electric leakage detector according to this embodiment.

The electric leakage detector 5 includes a zero-phase current transformer 51 and an electric leakage detection circuit 52. The zero-phase current transformer 51 is provided so as to surround the power supply line 1 on the outer side relative to the power converter 4 in the electric vehicle 101. The zero-phase current transformer 51 is made of a magnetic material. As shown in FIG. 5, when a leakage current is generated in the power supply line 1, a magnetic field is generated in the zero-phase current transformer 51 installed so as to surround the power supply line 1, and a current as an electric leakage detection signal flows through a secondary winding wire 51*a* of the zero-phase current transformer 51. The magnitude of the current as the electric leakage detection signal generated in the secondary winding wire 51*a* is a value proportional to the value of the leakage current that flows through the power supply line 1. That is, when electric leakage occurs in the power supply line 1, the magnitude of the current that flows through the secondary winding wire 51*a* changes in proportion to the magnitude of the leakage current that flows through the power supply line 1 due to the electric leakage. The current as the electric leakage detection signal generated in the secondary winding wire 51*a* is detected by the electric leakage detection circuit 52. The electric leakage detection circuit 52 outputs, to the power conversion controller 7, the value of the current generated in the secondary winding wire 51*a* as a detected value a, which is a detection result.

The failure determiner 6 outputs a pulse current to reproduce, in a simulated manner, the electric leakage that occurs in the power supply line 1 in order to determine the failure of the electric leakage detector 5 while the power conversion operation of the power converter 4 is stopped. The failure determiner 6 includes an auxiliary winding wire 61 and an electric leakage test circuit 62.

Figure 6:
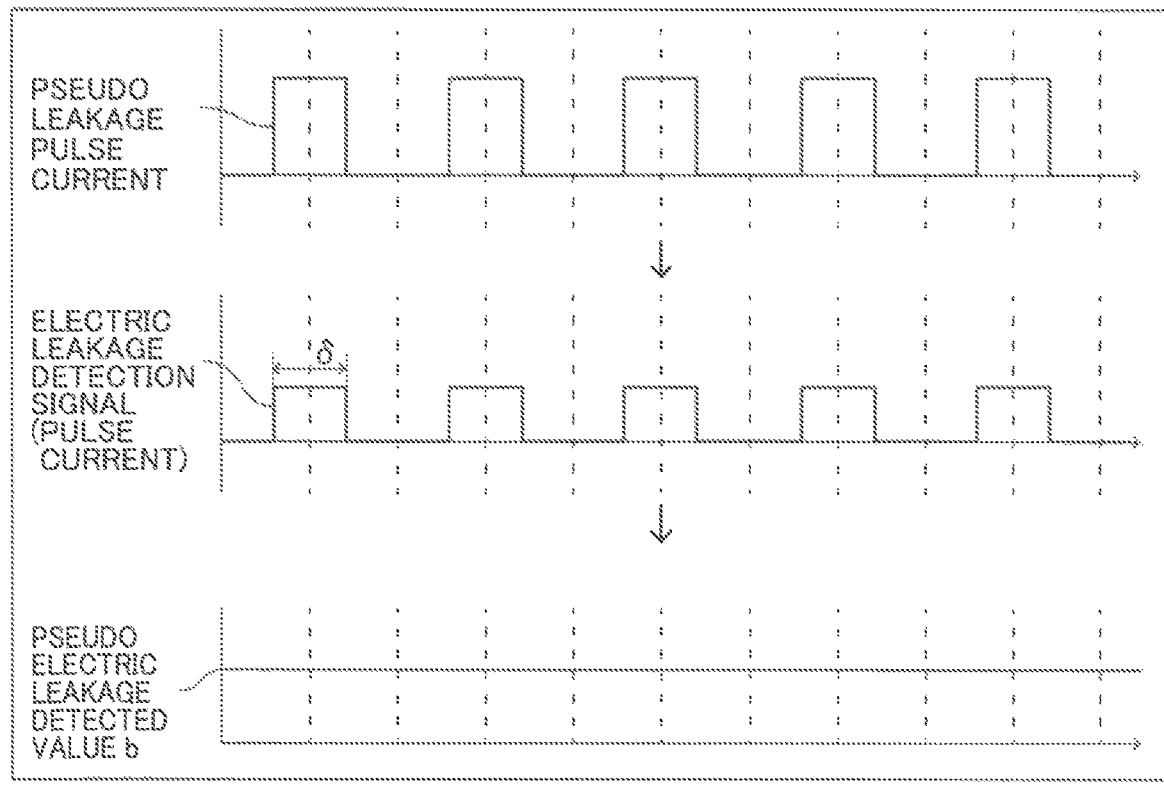
FIG. 6 is a diagram for illustrating the output of a pseudo electric leakage detected value by the electric leakage detector according to this embodiment.

As shown in FIG. 6, the electric leakage test circuit 62 outputs a pseudo leakage pulse current to reproduce a current caused by the electric leakage that occurs in the power supply line 1 based on the pulse width of a pulse signal output by the power conversion controller 7. The pseudo leakage pulse current output by the electric leakage test circuit 62 flows through the auxiliary winding wire 61. A magnetic field is generated in the zero-phase current transformer 51 due to the pseudo leakage pulse current that flows through the auxiliary winding wire 61, and a pulse current corresponding to the leakage current of the power supply line 1 flows through the secondary winding wire 51*a* of the zero-phase current transformer 51. That is, the electric leakage detector 5 acquires the pulse current as the electric leakage detection signal based on the pulse current output from the failure determiner 6. Then, the pulse current as the electric leakage detection signal generated in the secondary winding wire 51*a* is detected by the electric leakage detection circuit 52. That is, the electric leakage detection circuit 52 outputs a pseudo electric leakage detected value b to the power conversion controller 7 in response to the pulse current as the electric leakage detection signal generated in the secondary winding wire 51*a*. Specifically, the electric leakage detection circuit 52 outputs the pulse width δ of the pulse current as the electric leakage detection signal as the pseudo electric leakage detected value b, which is a detection result. That is, as the pulse width δ increases, the pseudo electric leakage detected value b increases, and as the pulse width δ decreases, the pseudo electric leakage detected value b decreases. The failure determiner 6 generates a pseudo leakage pulse current in the electric leakage test circuit 62 such that the pseudo electric leakage detected value b output from the electric leakage detector 5 becomes a value equal to or same as the detected value a output from the electric leakage detector 5 when electric leakage occurs in the power supply line 1.

As shown in FIG. 2, the power conversion controller 7 includes a central processing unit 71 (CPU) and a microcomputer (microcontroller) including a flash memory 72 etc. The power conversion controller 7 controls each portion of the power conversion device 100.

Control of Power Conversion by Power Converter

As shown in FIG. 4, the power conversion controller 7 controls power conversion by the power converter 4. Specifically, the power conversion controller 7 outputs a control signal (PWM signal) to control the on and off states of the switching elements Sw (IGBTs) included in the bridge 41 of the power converter 4. Then, the power conversion controller 7 performs a PWM control on the power converter 4 by outputting the PWM signal as the control signal. That is, the power conversion controller 7 controls the power converter 4 to perform, in a switching manner, conversion of the DC power output from the power storage 110 inside the electric vehicle 101 to output the AC power to the external device side and conversion of the AC power input from the AC power source outside the electric vehicle 101 to output the DC power to the power storage 110 side.

Control to Detect Electric Leakage

In this embodiment, as shown in FIG. 5, the power conversion controller 7 determines that electric leakage has occurred in the power supply line 1 when the current that flows through the secondary winding wire 51a of the zero-phase current transformer 51 is larger than an electric leakage threshold α (predetermined threshold). That is, the power conversion controller 7 determines that electric leakage has occurred in the power supply line 1 when the detected value a output by the electric leakage detection circuit 52 of the electric leakage detector 5 based on the current that flows through the secondary winding wire 51a is larger than the defined electric leakage threshold α. The power conversion controller 7 determines that electric leakage has occurred in the power supply line 1 when the value of the leakage current that flows through the power supply line 1 is 8 mA or more, for example. That is, the power conversion controller 7 defines the detected value a output by the electric leakage detection circuit 52 as the electric leakage threshold α when the current that flows through the power supply line 1 is 8 mA.

In this embodiment, the power conversion controller 7 stops the power conversion operation of the power converter 4 based on the detection result of the electric leakage detector 5. That is, the power conversion controller 7 stops the power conversion operation of the power converter 4 when the detected value a output by the electric leakage detection circuit 52 is larger than the defined electric leakage threshold α. Specifically, the power conversion controller 7 stops the power conversion operation of the power converter 4 by turning off the switching elements Sw (IGBTs) by stopping the output of the control signal (PWM signal). The power conversion controller 7 stops the gate signal output from the gate drive unit 44 of the power converter 4 by stopping the output of the PWM signal, which is the control signal to perform a PWM control on the power converter 4, and stops the switching operation of the IGBTs included in the bridge 41 when electric leakage in the power supply line 1 is detected. The power conversion controller 7 turns off conduction in the IGBTs by stopping the switching operation of the IGBTs of the bridge 41 of the power converter 4. Then, the power conversion controller 7 stops the power conversion operation of the power converter 4 by turning off conduction in the IGBTs, and electrically cuts off the power supply line 1 through which the DC power input from the power storage 110 flows from the power supply line 1 on the external device side of the power converter 4.

The power conversion controller 7 stops the power conversion operation of the power converter 4 and causes the breaker 2 to cut off the power supply line 1 based on the detection result (detected value a) of the electric leakage detector 5. Specifically, when the detected value a output by the electric leakage detection circuit 52 is larger than the electric leakage threshold α, the power conversion controller 7 stops the output of the control signal to the power converter 4 and outputs, to the breaker 2, a signal to cut off the power supply line 1. That is, when the detected value a output by the electric leakage detection circuit 52 is larger than the electric leakage threshold α, the power conversion controller 7 stops the power conversion operation of the power converter 4 and causes the breaker 2 to cut off the power supply line 1 at the same timing (simultaneously). Note that the response speed of the power supply line 1 cutoff operation of the breaker 2 is lower (the operation is slower) than the response speed of stop of the power conversion operation of the power converter 4. Therefore, in reality, the timing at which the power supply line 1 is cut off by the breaker 2 is later than the timing at which the power conversion operation of the power converter 4 is stopped.

About Electric Leakage Detection Information

In this embodiment, the power conversion controller 7 acquires electric leakage detection information based on the detected value a, which is the detection result of the electric leakage detector 5. Then, the power conversion controller 7 outputs the acquired electric leakage detection information to the vehicle body-side controller 150 mounted on the electric vehicle 101. Specifically, the power conversion controller 7 acquires the electric leakage detection information when the detected value a, which is the detection result of the electric leakage detector 5, is larger than the electric leakage threshold α when AC power is output to the outside of the electric vehicle 101 by the power converter 4. When acquiring the electric leakage detection information, the power conversion controller 7 outputs the electric leakage detection information, which is information indicating that there is electric leakage outside the electric vehicle 101, to the vehicle body-side controller 150. The electric leakage detection information includes the time at which electric leakage is detected, a current that flows through the power supply line 1 when the electric leakage is detected, and a current value and a voltage value output when the electric leakage is detected, for example.

Figure 7:
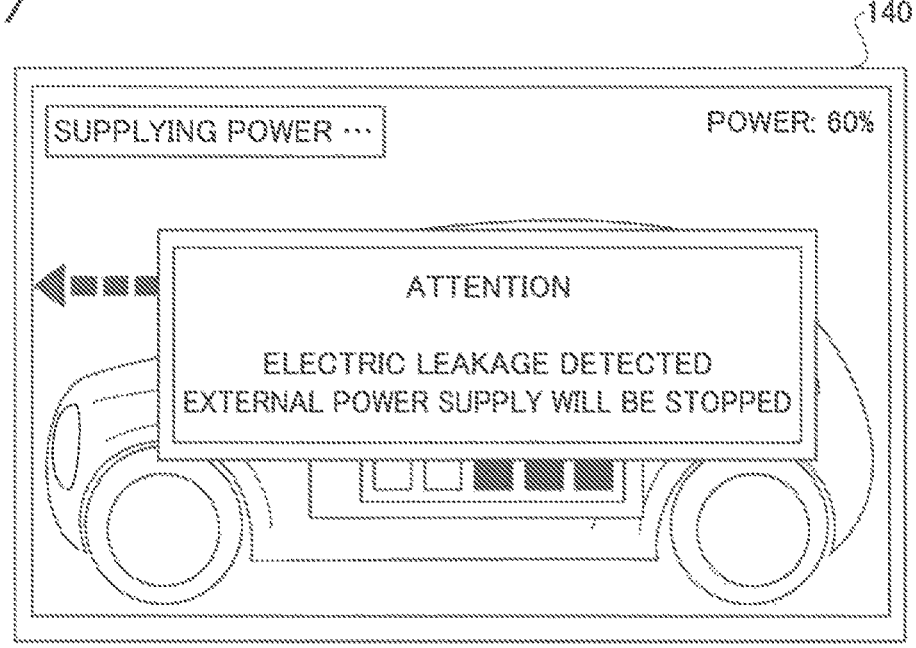
FIG. 7 is a diagram for illustrating a display of the display device when electric leakage is detected according to this embodiment.

As shown in FIG. 7, the vehicle body-side controller 150 notifies the user that the external power supply line is in an electric leakage state based on the electric leakage detection information from the power conversion controller 7. Specifically, the vehicle body-side controller 150 displays, on the display device 140, information for notifying the user that the outside of the electric vehicle 101 is in an electric leakage state based on the electric leakage detection information from the power conversion controller 7. Furthermore, the vehicle body-side controller 150 stops the DC power output from the power storage 110 based on the electric leakage detection information from the power conversion controller 7.

The power conversion controller 7 stores the acquired electric leakage detection information. Specifically, when acquiring the electric leakage detection information, the power conversion controller 7 stores, as the electric leakage detection information, information such as the time at which electric leakage is detected, a current that flows through the power supply line 1 when the electric leakage is detected, and a current value and a voltage value output when the electric leakage is detected, which are included in the acquired electric leakage detection information. The power conversion controller 7 stores the acquired electric leakage detection information in the flash memory 72.

About Failure Diagnosis of Electric Leakage Detector

Figure 8:
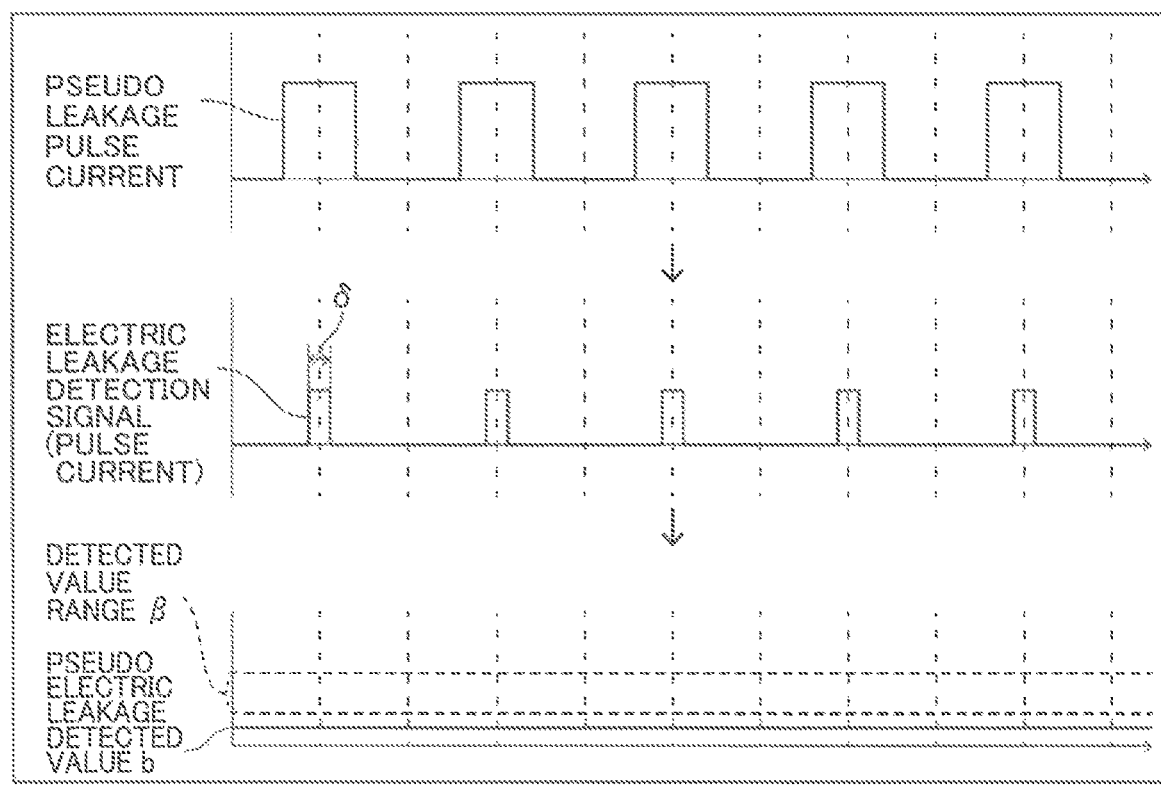
FIG. 8 is a diagram for illustrating determination of the failure of the electric leakage detector according to this embodiment.

As shown in FIG. 8, the power conversion controller 7 determines the failure of the electric leakage detector 5 depending on whether or not the pulse width δ of the pulse current as the electric leakage detection signal acquired by the electric leakage detector 5 is within a detected value range β (predetermined range). Specifically, the power conversion controller 7 acquires, as the pseudo electric leakage detected value b output by the electric leakage detection circuit 52 of the electric leakage detector 5, the pulse width δ of the pulse current as the electric leakage detection signal. Then, the power conversion controller 7 determines the failure of the electric leakage detector 5 based on the acquired pseudo electric leakage detected value b. That is, the power conversion controller 7 determines the failure of the electric leakage detector 5 depending on whether or not the acquired pseudo electric leakage detected value b is included in the detected value range β.

For example, the power conversion controller 7 acquires a range of 80% or more and 120% or less of the detected value a (electric leakage threshold α) output by the electric leakage detection circuit 52 when electric leakage occurs in the power supply line 1 as the detected value range β, which is the range of the detected value a in which the electric leakage detector 5 is operating normally. Then, the power conversion controller 7 outputs, to the failure determiner 6, a pulse current to determine the failure of the electric leakage detector 5. Specifically, the power conversion controller 7 outputs, to the electric leakage test circuit 62, a pulse current having a pulse width such that the pseudo electric leakage detected value b is equal to (the same as) the detected value a. That is, a pseudo leakage pulse current is output to the electric leakage test circuit 62 such that the pseudo electric leakage detected value b becomes a value equal to or same as the detected value a. Therefore, when the electric leakage detector 5 is normal, due to the pulse current output from the electric leakage test circuit 62, the electric leakage detection circuit 52 outputs the pseudo electric leakage detected value b, which is the value corresponding to the detected value a caused by electric leakage (the value equivalent to the detected value a). The power conversion controller 7 determines the failure of the electric leakage detector 5 depending on whether or not the acquired pseudo electric leakage detected value b is included in the detected value range β. That is, when the acquired pseudo electric leakage detected value b is included in the detected value range β, the power conversion controller 7 determines that the electric leakage detector 5 determines that the electric leakage detection operation of the electric leakage detector 5 is normal, assuming that the pulse width δ of the pulse current as the electric leakage detection signal is within a predetermined range. When the acquired pseudo electric leakage detected value b is not included in the detected value range β, the power conversion controller 7 determines that the electric leakage detection operation of the electric leakage detector 5 is not normal (the electric leakage detector 5 has failed), assuming that the pulse width δ of the pulse current as the electric leakage detection signal is not within the predetermined range.

The power conversion controller 7 acquires a determination result that the electric leakage detector 5 is normal when the pulse width δ of the pulse current as the electric leakage detection signal acquired by the electric leakage detector 5 is within the predetermined range, acquires a determination result that a layer short has occurred in the electric leakage detector 5 when the pulse width δ of the pulse current as the electric leakage detection signal acquired by the electric leakage detector 5 is a value larger than the predetermined range, and acquires a determination result that the electric leakage detector 5 has been disconnected when the pulse width δ of the pulse current as the electric leakage detection signal acquired by the electric leakage detector 5 is a value smaller than the predetermined range.

When a layer short has occurred in the secondary winding wire 51a of the zero-phase current transformer 51 of the electric leakage detector 5, the current that flows through the secondary winding wire 51a is a larger value than in the normal case. Therefore, when the secondary winding wire 51a is in a layer short state, the pulse width δ of the pulse current as the electric leakage detection signal becomes large. Therefore, the pseudo electric leakage detected value b as the detection result becomes larger than the normal value. When disconnection or bad soldering, for example, has occurred in the electric leakage detector 5, the current that flows through the secondary winding wire 51a becomes small (the current does not flow). Thus, when disconnection or bad soldering, for example, has occurred in the electric leakage detector 5, the pulse width δ of the pulse current as the electric leakage detection signal becomes small. Therefore, the pseudo electric leakage detected value b as the detection result becomes smaller than the normal value.

The power conversion controller 7 acquires the detected value range β based on the detected value a as the detection result output by the electric leakage detector 5 when electric leakage occurs in the power supply line 1. Then, the power conversion controller 7 acquires a determination result that the electric leakage detector 5 is normal, assuming that the pulse width δ of the pulse current as the electric leakage detection signal is within the predetermined range when the pseudo electric leakage detected value b acquired to determine the failure of the electric leakage detector 5 is included in the detected value range β. Furthermore, the power conversion controller 7 acquires a determination result that a layer short has occurred in the electric leakage detector 5, assuming that the pulse width δ of the pulse current as the electric leakage detection signal is a value larger than the predetermined range when the pseudo electric leakage detected value b is larger than the detected value range β. The power conversion controller 7 acquires a determination result that disconnection has occurred in the electric leakage detector 5, assuming that the pulse width δ of the pulse current as the electric leakage detection signal is a value smaller than the predetermined range when the pseudo electric leakage detected value b is smaller than the detected value range β. For example, as shown in FIG. 8, when the pulse width δ of the pulse current as the electric leakage detection signal is smaller than the predetermined range, the pseudo electric leakage detected value b becomes a value smaller than the detected value range β. Therefore, in the case of an example shown in FIG. 8, the power conversion controller 7 acquires a determination result that disconnection has occurred in the electric leakage detector 5.

The power conversion controller 7 causes the power converter 4 not to operate when determining that the electric leakage detector 5 has failed based on the acquired determination result. That is, when it is determined that the electric leakage detector 5 has failed, a control signal (PWM signal) to cause the power converter 4 to operate is not output.

The power conversion controller 7 outputs the determination result regarding the failure of the electric leakage detector 5 to the vehicle body-side controller 150 mounted on the electric vehicle 101. Furthermore, the power conversion controller 7 stores the determination result regarding the failure of the electric leakage detector 5 in the flash memory 72.

The power conversion controller 7 determines the failure of the electric leakage detector 5 by outputting a pulse signal to the failure determiner 6 before causing the power converter 4 to perform the power conversion operation when the power converter 4 converts the DC power from the power storage 110 into AC power. The power conversion controller 7 may determine the failure of the electric leakage detector 5 by outputting a pulse signal to the failure determiner 6 at the timing at which the power conversion operation by the power converter 4 is completed.

Advantageous Effects of this Embodiment

According to this embodiment, the following advantageous effects are achieved.

According to this embodiment, as described above, the power conversion controller 7 stops the power conversion operation of the power converter 4 based on the detection result of the electric leakage detector 5. Accordingly, when the electric leakage detector 5 acquires the detection result indicating that electric leakage has occurred in the power supply line 1, the output of the AC power from the power converter 4 can be stopped. In general, as compared with a case in which conduction in the power supply line 1 is cut off by a mechanical breaking device such as a breaker, conduction in the power supply line 1 can be more quickly cut off by stopping the power conversion operation of the power converter 4 under control of the power conversion controller 7. Therefore, conduction in the power supply line 1 can be quickly cut off by performing a control to stop the power conversion operation of the power converter 4 instead of using a mechanical breaking device such as a breaker. Consequently, in case electric leakage is detected when DC power is converted into AC power and output, conduction of the AC power can be cut off more quickly.

According to this embodiment, as described above, the power converter 4 performs, in a switching manner, conversion of the DC power output from the power storage 110 inside the electric vehicle 101 (vehicle) into AC power and conversion of the AC power input from the AC power source outside the electric vehicle 101 into DC power with which the power storage 110 is chargeable, and the electric leakage detector 5 detects electric leakage in the power supply line 1 when the AC power output from the power converter 4 is output to the outside of the electric vehicle 101. Accordingly, even when power conversion to charge the power storage 110 of the electric vehicle 101 and power conversion to supply power to the external device by discharging from the power storage 110 are performed by a common device, it is possible to detect electric leakage that occurs when power is being supplied to the external device without additionally providing a new device configuration. Consequently, when power is supplied from the power storage 110 of the electric vehicle 101 to the external device, it is possible to stop power output more quickly when there is electric leakage while significantly reducing or preventing the complexity of the device configuration.

According to this embodiment, as described above, the electric leakage detector 5 detects electric leakage in the power supply line 1 due to electric leakage on the side of the external device externally connected to the electric vehicle 101 (vehicle). When power is supplied from the electric vehicle 101 to the external device in which electric leakage has occurred, an unintended current flows through the power supply line 1 and the external device. Therefore, as described above, the electric leakage detector 5 is configured to detect electric leakage in the power supply line 1 due to electric leakage on the side of the external device externally connected to the electric vehicle 101 such that even when electric leakage occurs outside the electric vehicle 101, power supply can be stopped quickly. Consequently, when power is supplied to the external device in which electric leakage has occurred, flowing of an unintended current to the power supply line 1 and the external device can be significantly reduced or prevented.

According to this embodiment, as described above, the electric leakage detector 5 includes the zero-phase current transformer 51 provided so as to surround the power supply line 1 on the outer side relative to the power converter 4 in the electric vehicle 101 (vehicle), and the power conversion controller 7 determines that electric leakage has occurred in the power supply line 1 when the current that flows through the secondary winding wire 51a of the zero-phase current transformer 51 is larger than the electric leakage threshold $\alpha$ (predetermined threshold). When no electric leakage occurs in the power supply line 1, the total value of the single-phase three-wire AC power taking into account the magnitude and direction of the current that flows through the power supply line 1 is 0. When electric leakage occurs in the power supply line 1, the total value of the single-phase three-wire AC power taking into account the magnitude and direction of the current that flows through the power supply line 1 becomes a value other than 0, and this becomes the leakage current value. In this embodiment, as described above, the zero-phase current transformer 51 is provided so as to surround the power supply line 1 on the outer side relative to the power converter 4 in the electric vehicle 101. Accordingly, a magnetic field is generated in the zero-phase current transformer 51 according to the leakage current value of the power supply line 1. Then, due to the magnetic field generated in the zero-phase current transformer 51, a current is generated in the secondary winding wire 51a of the zero-phase current transformer 51. Therefore, the zero-phase current transformer 51 can detect, as a current that flows through the secondary winding wire 51a, a current having a magnitude proportional to the leakage current value of the power supply line 1. Consequently, the electric leakage detector 5 can detect that electric leakage has occurred in the power supply line 1 based on the current that flows through the secondary winding wire 51a. Furthermore, the power conversion controller 7 determines that electric leakage has occurred in the power supply line 1 when the current that flows through the secondary winding wire 51a of the zero-phase current transformer 51 is larger than the electric leakage threshold $\alpha$ (predetermined threshold), and thus a current smaller than the electric leakage threshold $\alpha$ and accidentally generated in the secondary winding wire 51a due to noise or the like can be prevented from being detected as electric leakage in the power supply line 1. Therefore, it is possible to significantly reduce or prevent frequent stopping of power supply from the power converter 4 due to a small current accidentally generated in the secondary winding wire 51a.

According to this embodiment, as described above, the power conversion device 100 includes the breaker 20 to cut off conduction in the power supply line 1 under control of the power conversion controller 7, and the power conversion controller 7 stops the power conversion operation of the power converter 4 and causes the breaker 2 to cut off the power supply line 1 based on the detected value a (detection result) of the electric leakage detector 5. Accordingly, when electric leakage is detected, in addition to stopping the output from the power converter 4, the breaker 2 can cut off conduction in the power supply line 1, and thus conduction in the power supply line 1 can be physically cut off while generation of a leakage current is significantly reduced or prevented. Therefore, it is possible to more effectively significantly reduce or prevent generation of a leakage current due to the electric leakage in the power supply line 1.

According to this embodiment, as described above, the power converter 4 includes the switching elements Sw (IGBTs) that are switched on and off based on a control signal from the power conversion controller 7, and the power conversion controller 7 stops the power conversion operation of the power converter 4 by turning off the switching elements Sw by stopping the output of the control signal. In general, the response speed of the switching elements Sw including the semiconductor devices included in the power converter 4 is higher than the response speed of a mechanical breaking device such as a breaker or a mechanical relay. Therefore, as compared with a case in which power supply is cut off by a mechanical breaking device to stop the conversion operation of the power converter 4, power output can be stopped more quickly by stopping the power conversion operation by controlling the switching elements Sw. Furthermore, the switching elements Sw can be turned off by stopping the output of the control signal, and thus power output can be easily stopped when electric leakage is detected.

According to this embodiment, as described above, the power conversion controller 7 acquires the electric leakage detection information based on the detection result of the electric leakage detector 5, and outputs the acquired electric leakage detection information to the vehicle body-side controller 150 mounted on the vehicle. Accordingly, the information indicating that electric leakage has been detected by the electric leakage detector 5 can be acquired by the vehicle body-side controller 150 that controls each portion of the electric vehicle 101 (vehicle). Therefore, in the case of electric leakage, the operation of each portion of the electric vehicle 101 can be controlled by the vehicle body-side controller 150. That is, under control of the vehicle body-side controller 150, the user can be notified by displaying detection of electric leakage on the display device 140, and power output from the power storage 110 can be stopped, for example. Consequently, the electric leakage detection information is output to the vehicle body-side controller 150 such that a control to deal with the electric leakage can be performed outside the power conversion device 100.

According to this embodiment, as described above, the power conversion controller 7 stores the acquired electric leakage detection information. Accordingly, when electric leakage is detected, detailed information about the detected electric leakage can be stored. Therefore, an inspection worker can easily confirm and verify the detected electric leakage by referring to the stored electric leakage detection information when confirming and verifying the detected electric leakage.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the power converter is mounted on the electric vehicle (vehicle) in the aforementioned embodiment, the present invention is not limited to this. For example, the power converter may not be mounted on the vehicle. That is, the power converter may be mounted on a marine vessel, for example. Alternatively, the power converter may be mounted on a power conversion device that is configured independently of and separately from the vehicle.

While the power converter converts the DC power output from the power storage mounted on the electric vehicle (vehicle) into AC power in the aforementioned embodiment, the present invention is not limited to this. For example, the power converter may alternatively convert DC power output by a lithium-ion battery included in a household power storage system into AC power.

While the power converter performs, in a switching manner, conversion of the DC power output from the power storage inside the electric vehicle (vehicle) into AC power and conversion of the AC power input from the AC power source outside the electric vehicle into DC power with which the power storage is chargeable, and the electric leakage detector detects electric leakage in the power supply line when the AC power output from the power converter is output to the outside of the electric vehicle in the aforementioned embodiment, the present invention is not limited to this. For example, the power converter may not convert the AC power input from the AC power source outside the electric vehicle into DC power with which the power storage is chargeable. That is, the power converter may convert the DC power output from the power storage into AC power, and a device such as an inverter provided separately from the power converter may convert the AC power input from the external AC power source into DC power with which the power storage is chargeable.

While the electric leakage detector detects electric leakage in the power supply line due to electric leakage on the side of the external device externally connected to the electric vehicle (vehicle) in the aforementioned embodiment, the present invention is not limited to this. For example, the electric leakage detector may alternatively detect electric leakage in the power supply line due to electric leakage both outside and inside the electric vehicle.

While the electric leakage detector includes the zero-phase current transformer provided so as to surround the power supply line on the outer side relative to the power converter in the vehicle, and the power conversion controller determines that electric leakage has occurred in the power supply line when the current that flows through the secondary winding wire of the zero-phase current transformer is larger than the electric leakage threshold (predetermined threshold) in the aforementioned embodiment, the present invention is not limited to this. For example, the electric leakage detector may alternatively include a current transformer that detects a current in only one of three single-phase wires, instead of the zero-phase current transformer. Alternatively, when a predetermined period is provided in addition to the predetermined threshold, and a current larger than the predetermined threshold flows in a period longer than the predetermined period, the power conversion controller may determine that electric leakage has occurred in the power supply line.

While the power conversion device includes the breaker to cut off conduction in the power supply line under control of the power conversion controller, and the power conversion controller stops the power conversion operation of the power converter and causes the breaker to cut off the power supply line based on the detection result of the electric leakage detector in the aforementioned embodiment, the present invention is not limited to this. For example, the breaker may alternatively operate with a current that flows through the secondary winding wire of the zero-phase current transformer. Alternatively, the breaker that cuts off conduction in the power supply line may not be provided.

While the power converter includes the switching elements that are switched on and off based on the control signal from the power conversion controller, and the power conversion controller stops the power conversion operation of the power converter by turning off the switching elements by stopping the output of the control signal in the aforementioned embodiment, the present invention is not limited to this. For example, the power converter may not use normally-off switching elements to turn off the conduction state by stopping the output of the control signal (stopping voltage application to a gate) but may use normally-on switching elements to turn off the conduction state by applying a voltage to the gate. That is, the power conversion controller may stop the power conversion operation of the power converter by outputting a stop signal to stop the operation of the power converter.

While the power conversion controller acquires the electric leakage detection information based on the detection result of the electric leakage detector, and outputs the acquired electric leakage detection information to the vehicle body-side controller mounted on the electric vehicle (vehicle) in the aforementioned embodiment, the present invention is not limited to this. For example, the power conversion controller may not acquire the electric leakage detection information. Furthermore, the power conversion controller may not output the acquired electric leakage detection information to the vehicle body-side controller. That is, a notifier such as a light-emitting diode (LED) indicator may be further provided, and the power conversion controller may notify the user that electric leakage has been detected in the power supply line by controlling the operation of the notifier based on the acquired electric leakage detection information.

While the power conversion controller stores the acquired electric leakage detection information in the aforementioned embodiment, the present invention is not limited to this. For example, a storage separate from the power conversion controller may alternatively be newly provided, and the acquired electric leakage detection information may alternatively be stored in the storage.

While the electric vehicle is used as an example of a vehicle that constitutes the external power supply system in the aforementioned embodiment, the present invention is not limited to this. For example, a fuel cell vehicle may alternatively be used.

What is claimed is:

1. A power conversion device comprising:
a power converter to output AC power by converting input DC power;
an electric leakage detector to detect electric leakage in a power supply line through which the AC power output by the power converter flows when the AC power is being output by the power converter; and
a power conversion controller configured to control power conversion of the power converter;
wherein the power conversion controller is configured to stop power conversion operation of the power converter based on a detection result of the electric leakage detector;
the power converter performs, in a switching manner, conversion of DC power output from a power storage inside a vehicle into AC power and conversion of AC power input from an AC power source outside the vehicle into DC power with which the power storage is chargeable;
the electric leakage detector detects the electric leakage in the power supply line when the AC power output from the power converter is being output to an outside of the vehicle;
the electric leakage detector includes a zero-phase current transformer provided so as to surround the power supply line on an outer side relative to the power converter in the vehicle; and
the power conversion controller is configured to determine that the electric leakage has occurred in the power supply line when a current that flows through a secondary winding wire of the zero-phase current transformer is larger than a predetermined threshold.

2. A power conversion device comprising:
a power converter to output AC power by converting input DC power;
an electric leakage detector to detect electric leakage in a power supply line through which the AC power output by the power converter flows when the AC power is being output by the power converter; and
a power conversion controller configured to control power conversion of the power converter;
wherein the power conversion controller is configured to stop power conversion operation of the power converter based on a detection result of the electric leakage detector;
the power converter performs, in a switching manner, conversion of DC power output from a power storage inside a vehicle into AC power and conversion of AC power input from an AC power source outside the vehicle into DC power with which the power storage is chargeable;
the electric leakage detector detects the electric leakage in the power supply line when the AC power output from the power converter is being output to an outside of the vehicle; and
the power conversion controller is configured to acquire electric leakage detection information based on the detection result of the electric leakage detector, and output the acquired electric leakage detection information to a vehicle body-side controller mounted on the vehicle.

3. The power conversion device according to claim 2, wherein the power conversion controller is configured to store the acquired electric leakage detection information.

* * * * *